United States Patent [19]

Uesugi et al.

[11] Patent Number: 5,563,911
[45] Date of Patent: Oct. 8, 1996

[54] EQUALIZER FOR DATA RECEIVER APPARATUS

[75] Inventors: Mitsuru Uesugi; Kazuhisa Tsubaki; Kouichi Honma, all of Yokohama, Japan

[73] Assignee: Matsushita Electric Industrial Co., Ltd., Osaka, Japan

[21] Appl. No.: 395,828

[22] Filed: Feb. 28, 1995

Related U.S. Application Data

[63] Continuation of Ser. No. 937,403, Aug. 31, 1992, Pat. No. 5,444,739.

[30] Foreign Application Priority Data

Sep. 12, 1991 [JP] Japan ..................................... 3-232839

[51] Int. Cl.⁶ ....................................................... H04B 3/06
[52] U.S. Cl. ............................. 375/232; 375/229; 333/18
[58] Field of Search ..................................... 375/229, 232; 371/30; 333/18, 28 R; 364/724.2

[56] References Cited

U.S. PATENT DOCUMENTS

| | | | |
|---|---|---|---|
| 3,306,347 | 9/1975 | Motley et al. | 375/39 |
| 5,050,186 | 9/1991 | Gurcan et al. | 375/14 |
| 5,173,925 | 12/1992 | Mizoguchi | 375/14 |
| 5,214,671 | 5/1993 | Nakai | 375/14 |

FOREIGN PATENT DOCUMENTS

| | | | |
|---|---|---|---|
| 0453201 | 10/1991 | European Pat. Off. | 375/14 |
| 0466434 | 1/1992 | European Pat. Off. | 375/12 |
| 0188037 | 7/1989 | Japan | 375/11 |
| 0258511 | 10/1989 | Japan | 375/11 |
| 8802582 | 4/1988 | WIPO | 375/14 |

OTHER PUBLICATIONS

Mitsuru Uesugi, et al "Adaptive Equalization in TDMA Digital Mobile Radio", IEEE Global Telecommunications Conference and Exhibition 1989 Conference Record, vol. 1 of 3, pp. 95–101, Nov. 27–30, 1989, Dallas, Texas.

R. D'Avella, et al "Adaptive Equalization in TDMA Mobile Radio Systems", 37th IEEE Vehicular Technology Conference, 1–3 Jun. 1987, pp. 385–392.

*Primary Examiner*—Stephen Chin
*Assistant Examiner*—T. Ghebretinsae
*Attorney, Agent, or Firm*—Watson Cole Stevens Davis, P.L.L.C.

[57] ABSTRACT

In an equalizer including a plurality of delay elements, a plurality of weighting elements and an adder, the impulse response of a signal transmission channel is estimated to selectively switch over a plurality of selector switches associated with the inputs and outputs of the respective delay elements, thereby selectively changing the combination of the delay elements and the weighting elements transmitting an input signal from the channel to the adder and also changing the combination of the adder and a delay element feeding back the output of the discriminator to the adder. Thus, the number of required taps of the equalizer can be reduced, so that the power consumption and size of the equalizer can be reduced.

14 Claims, 5 Drawing Sheets

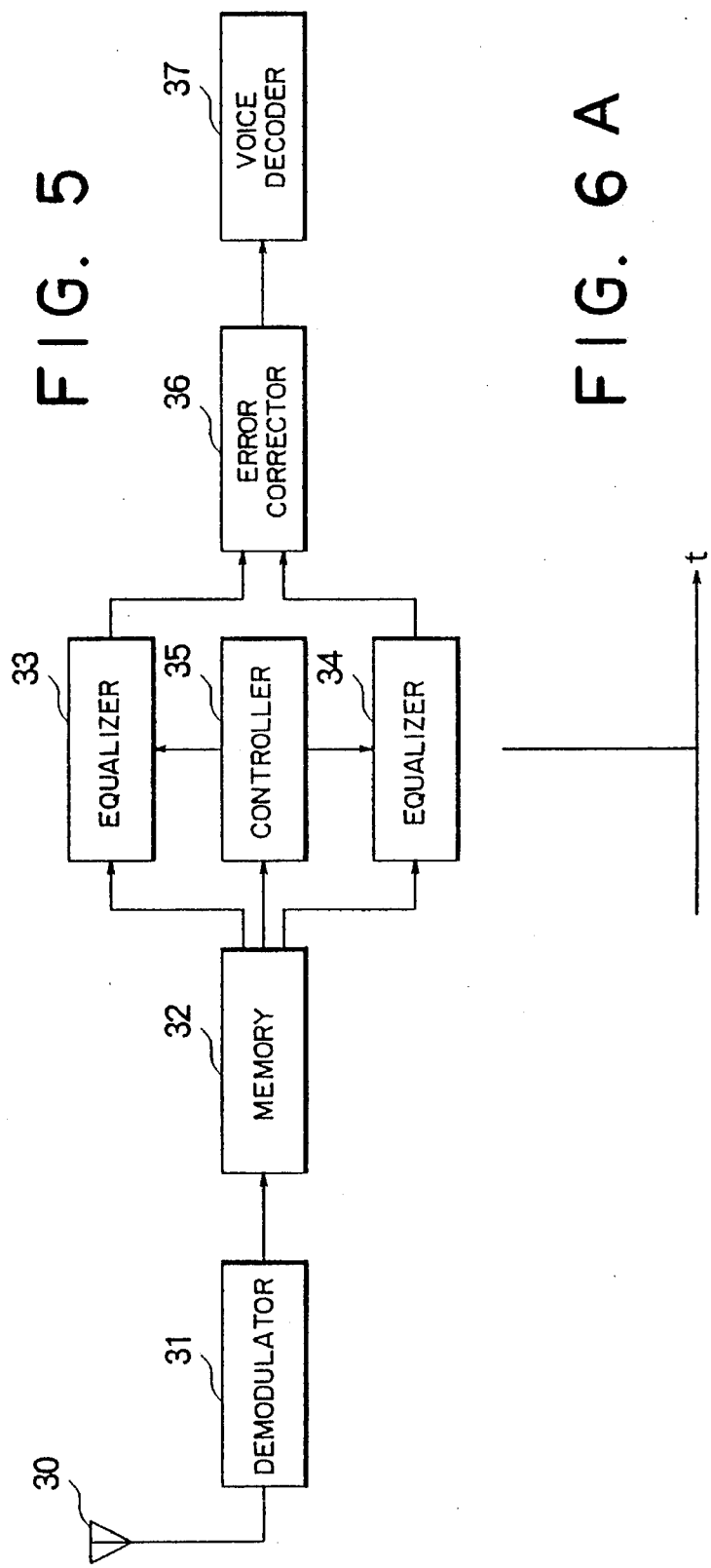

EQUALIZER FOR DATA RECEIVER APPARATUS

This is a continuation of application Ser. No. 07/937,403, filed Aug. 31, 1992 U.S. Pat. No. 5,444,739.

BACKGROUND OF THE INVENTION

This invention relates to an equalizer incorporated in a data receiver apparatus used in, for example, a digital mobile radio telephone system.

An equalizer of this kind is described in IEEE Global Telecommunications Conference & Exhibition, Dallas, Tex., Nov. 27–30, 1989, Conference Record Vol. 1 of 3, pp. 95–101. Such a will be first described before describing the present invention in detail later.

FIG. 1 shows the structure of one form of a burst signal processed by an equalizer incorporated in a data receiver apparatus used in, for example, a digital mobile radio telephone system, and FIG. 2 shows the waveform of an impulse response of a transmission channel. This impulse response includes not only that of an impulse signal transmitted from a transmitting antenna and directly received by a receiving antenna but also that of the impulse signal reflected by, for example, a building and then received by the receiving antenna with a delay time. FIG. 3 shows the structure of the prior art equalizer incorporated hitherto in the data receiver apparatus. Practically, two equalizers, each of which is as shown in FIG. 3, are used in the data receiver apparatus. In FIG. 3, a received signal is applied from an input terminal 1 to a plurality of delay elements 2. Outputs from a plurality of weighting elements 3 having respectively different weight coefficients are applied to an adder 4, and the output from the adder 4 is applied to a comparator 5 to appear as an output 6 from the equalizer. At the same time, the output 6 from the equalizer is applied to a plurality of delay elements 9 associated with a plurality of weighting elements 10.

The operation of the prior art equalizer shown in FIG. 3 will now be described. Referring to FIG. 3, the received signal is stored in a delay line of each of the delay elements 2 (six samples in the arrangement shown in FIG. 3), and, after the outputs appearing at individual taps are multiplied by the weight coefficients of the weighting elements 3 respectively, the outputs from the weighting elements 3 are added together by the adder 4. Thus, a digital filter of FIR (finite impulse response) type provides an output in which waveform distortion due to the signal transmission through the transmission channel is compensated. The comparator 5 acts to convert the output from the FIR type digital filter into the corresponding amplitude. (For example, in the case of GMSK modulation, the comparator 5 generates its output +1 when its input is positive and −1 when its input is negative.) This output from the comparator 5 provides the output 6 of the equalizer and is stored in a delay line of the each of the delay elements 9. After the outputs appearing at individual taps are multiplied by the weight coefficients of the weighting elements 10 respectively, the outputs from the weighting elements 10 are added together by the adder 4. Thus, a digital filter of IIR (infinite impulse response) type provides an output in which waveform distortion due to the signal transmission through the transmission channel is compensated. In FIG. 3, the digital filter of the FIR type and that of the IIR type are indicated by the blocks 11 and 12 surrounded by broken lines respectively.

The IIR type digital filter referred to above is effective only for waveform distortion due to waveform components (23 to 26 in FIG. 2) appearing after a main waveform component 22 (the component having the highest power level) relative to time. On the other hand, the FIR type digital filter is effective for both the components appearing after and before the main waveform component relative to time. However, the IIR type digital filter is more effective than the FIR type digital filter for the components appearing after the main waveform component relative to time.

Suppose now the case where the equalizer having the structure shown in FIG. 3 is used to deal with a burst signal in which a reference signal part is interposed between a former half data part and a latter half data part as shown in FIG. 1. In the burst signal shown in FIG. 1, both the former and latter half data are voice data subjected already to error correction coding, and the reference signal is in the form of a fixed pattern determined to meet the system. The reference signal part used in the burst signal is a digital pattern of "1" or "0". In the equalizer, the initial values of the weight coefficients of the weighting elements are determined on the basis of the reference signal. Thus, the latter half data part is equalized in a direction as shown by the arrow B in FIG. 1, while the former half data part is equalized in a direction as shown by the arrow A which is opposite to the direction B relative to time t. Therefore, in such a case, it is necessary to use two equalizers each having the structure shown in FIG. 3. Further, in FIG. 3, the range of signal waveform delays is selected to be, for example, 5T, where T represents the length of time of one symbol and is the reciprocal of the bit rate in the case of a binary modulation, such as, the GMSK modulation. That is, T=5 μs when the bit rate=200 kb/s. When the value of T is so selected, the maximum number of taps required for the FIR type digital filter is 6, because this digital filter is effective for waveform distortion due to both the waveform components appearing after and before the main waveform component relative to time. On the other hand, the maximum number of taps required for the IIR type digital filter is 5, because this digital filter is effective only for waveform distortion due to the components appearing after the main waveform component relative to time. Thus, taking into consideration the condition of the signal transmission channel, it is necessary to provide the maximum number of taps for each of these digital filters. Therefore, in this case, each of the two equalizers includes the 6-tap FIR type digital filter and the 5-tap IIR type digital filter.

As described above, the FIR type digital filter and the IIR type digital filter are combined to form the prior art equalizer incorporated in the data receiver apparatus. Therefore, the equalizer can compensate both the waveform distortion due to the components appearing after the main waveform component relative to time and that due to the components appearing before the main waveform component relative to time.

However, the prior art equalizer incorporated in the data receiver apparatus has had such various problems that, because the equalizer requires a large number of taps, the number of signal processing operations is correspondingly increased, and difficulty is encountered for reducing the power consumption and size of the equalizer.

SUMMARY OF THE INVENTION

It is an object of the present invention to provide an equalizer for use in a data receiver apparatus, in which the number of required taps is reduced without impairing the effect of compensation of waveform distortion due to signal transmission through a transmission channel, which reduces the number of required arithmetic and logical processing operations to about half of the prior art value, and which facilitates the desired reduction of the power consumption and size.

According to the present invention which attains the above object, the total number of the taps is reduced to about half of the prior art value by disposing a plurality of selector switches in line with the delay lines of the equalizer, so that the number of taps of the FIR and IIR type digital filters can be allocated to be optimized to deal with each burst signal.

Therefore, according to the present invention, the selector switches disposed in line with the delay lines of the equalizer are used to allocate the number of taps to be optimum for each burst signal, so that the total number of the taps can be reduced to about half of the prior art value, thereby reducing the number of required arithmetic and logical processing operations to about half of the prior art value and attaining the desired reduction of the power consumption and size of the equalizer.

BRIEF DESCRIPTION OF THE DRAWINGS

FIG. 5 shows the structure of a data receiver apparatus in which two equalizers embodying the present invention are incorporated.

FIG. 6A and 6B illustrate two forms of a channel impulse response.

DESCRIPTION OF THE PREFERRED EMBODIMENTS

Figure 3:
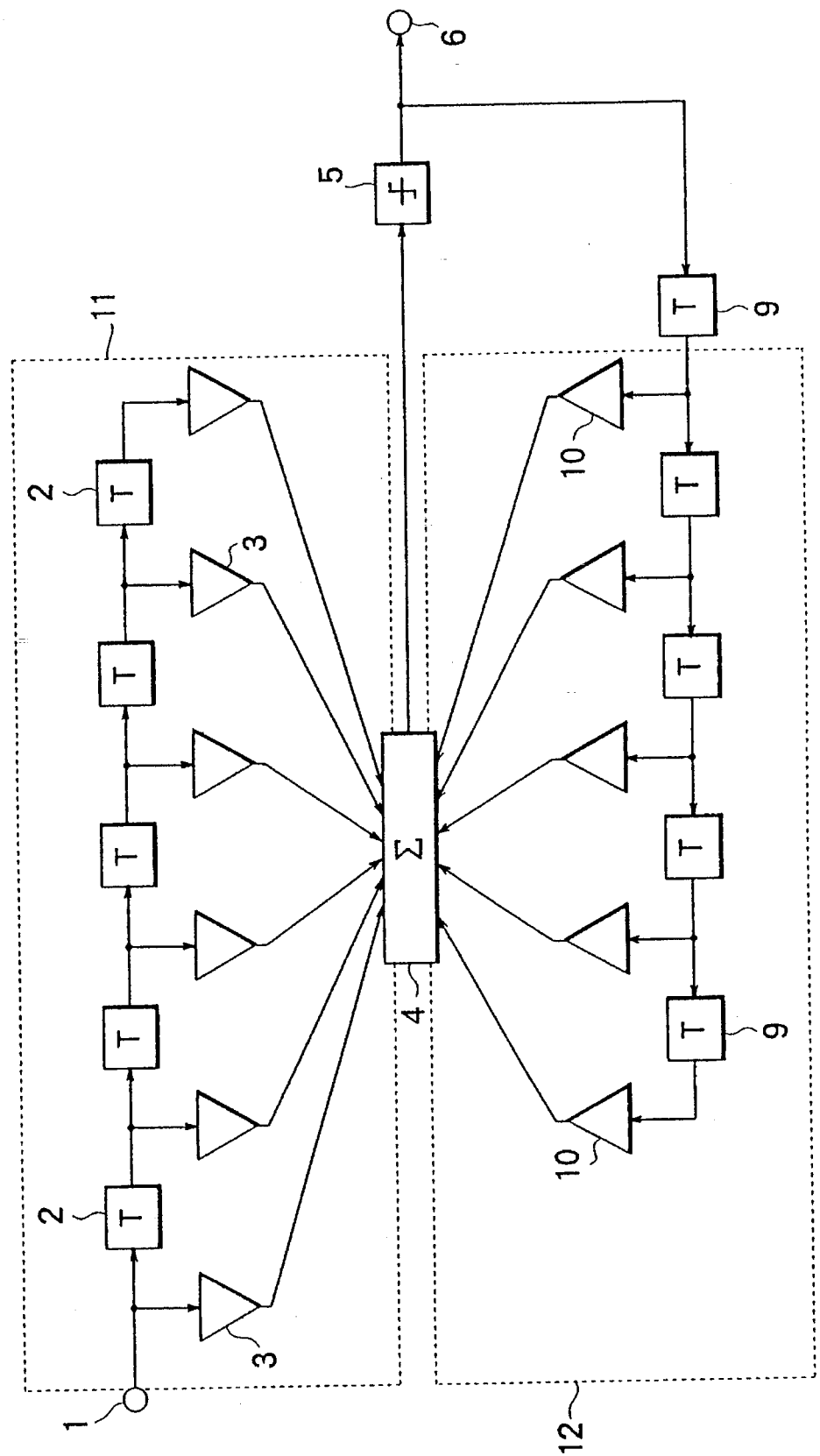
FIG. 3 is a block diagram showing the structure of a prior art equalizer incorporated hitherto in a data receiver apparatus.
Figure 4:
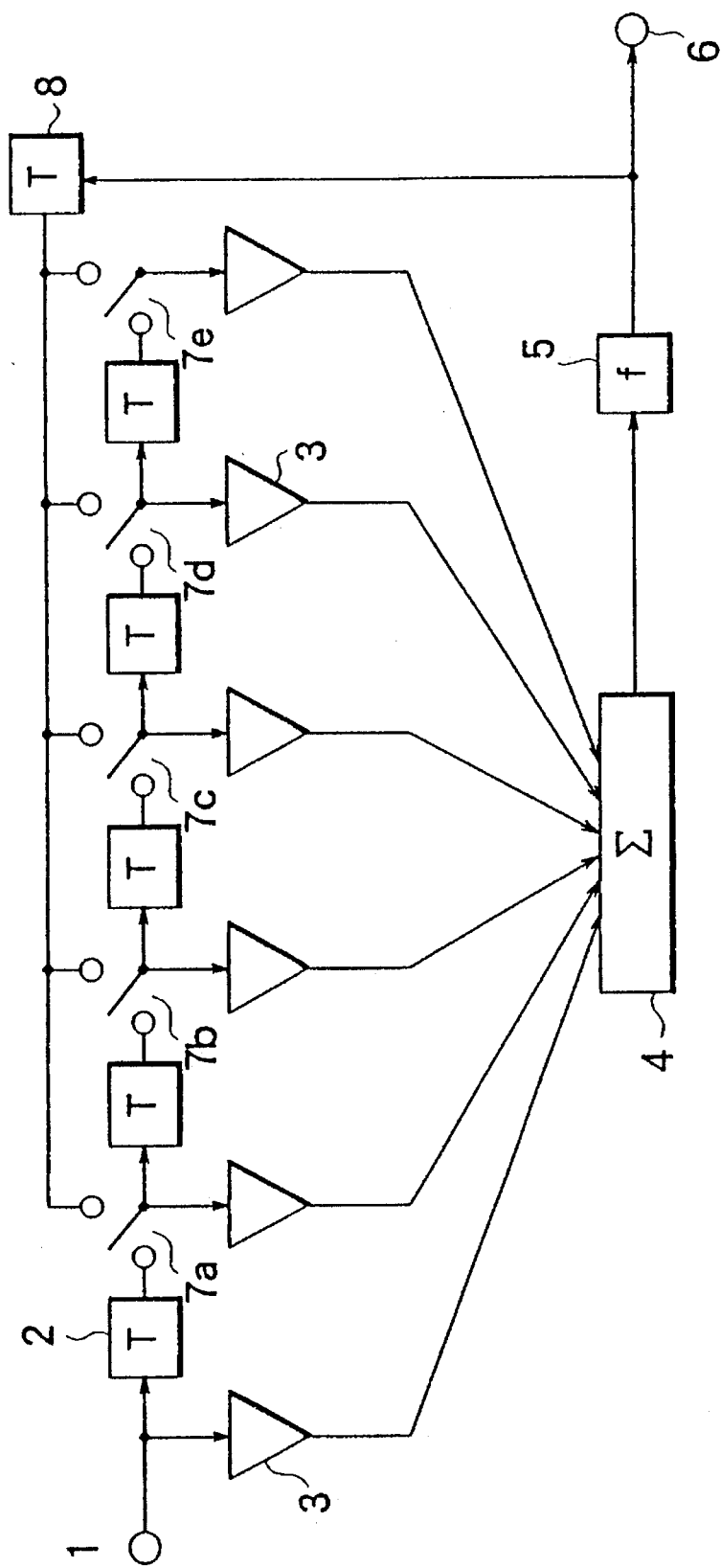
FIG. 4 is a block diagram showing the structure of an embodiment of the equalizer of the present invention suitable for use in a data receiver apparatus.

FIG. 4 is a block diagram showing the structure of an embodiment of the equalizer of the present invention suitable for use in a data receiver apparatus, and, in FIG. 4, like reference numerals are used to designate like parts appearing in FIG. 3. Referring to FIG. 4, an input signal is applied through a signal input terminal 1 to a plurality of delay elements 2. Outputs from a plurality of weighting elements 3 are applied to an adder 4, and the output from the adder 4 is applied to a comparator 5 to appear as an output 6 from the equalizer. At the same time, the output 6 from the equalizer is applied to another delay element 8. The equalizer according to the present invention further comprises a plurality of selector switches 7a to 7e disposed in line with the respective delay elements 2.

FIG. 5 shows the structure of a data receiver apparatus in which two equalizers 33 and 34 each having the structure as shown in FIG. 4 are incorporated. Referring to FIG. 5, an RF signal received by an antenna 30 is converted into its baseband signal by a demodulator 31. The RF signal referred to herein is a digital signal. The baseband signal is temporarily stored in a memory 32 before it is applied to the equalizers 33, 34 and a controller 35. The controller 35 controls the selector switches 7 in the equalizers 33 and 34 in response to the baseband signal stored in and applied from the memory 32. An error corrector 36 carries out error correction and decoding of the baseband signal, because the RF signal received by the antenna 30 has been subjected already to error correction coding at the signal transmitter. The digital signal subjected to the error correction and decoding in the error corrector 36 is then decoded into its original voice signal by a voice signal decoder 37 to appear as an output of the data receiver apparatus.

The operation of the data receiver apparatus shown in FIG. 5 will now be described. First, an RF signal received by the antenna 30 is demodulated by the demodulator 31 into its baseband signal. Then, the demodulated baseband signal is temporarily stored in the memory 32. This is because the input signal consists of a former half data part, a reference signal part and a latter half data part continuously arrayed from the left toward the right on the time base. Therefore, after storing the baseband signal in the memory 32, the latter half data part is equalized in the order of from the reference signal part to the latter half data part in the direction of the arrow B in FIG. 1, while the former half data part is equalized in the order of from the reference signal part to the former half data part in the direction of the arrow A which is opposite to the direction of progress of the time t. It is apparent that the equalizers 33 and 34 carry out selective equalization of the former half data part and the latter half data part only.

Figure 1:
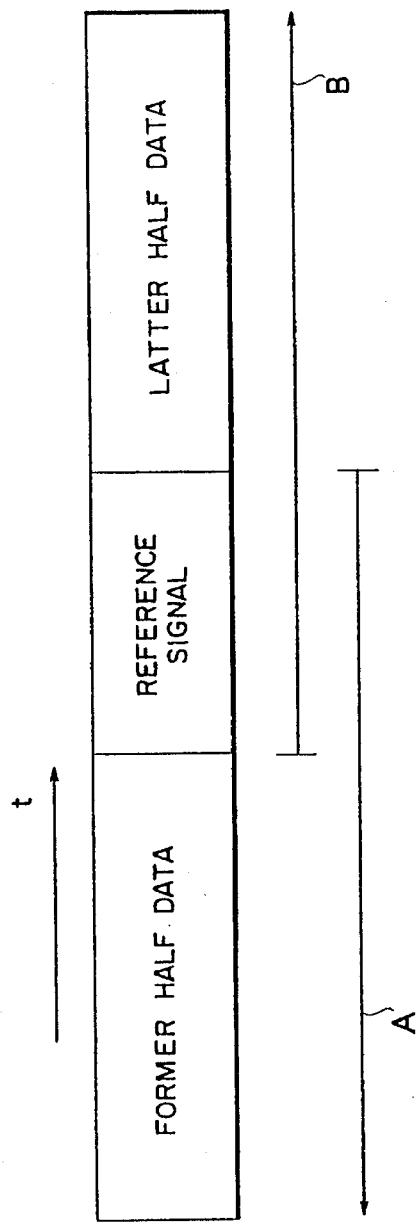
FIG. 1 shows the structure of one form of a burst signal.

Suppose now the case where these equalizers 33 and 34 are used to deal with a burst signal in which a reference signal part is interposed between a former half data part and a latter half data part as shown in FIG. 1. Herein, the reference signal is a known signal, and its auto-correlation is represented by an impulse signal as shown in FIG. 6A. Therefore, when the correlation between the input of the equalizers 33, 34 and the pattern of the reference signal that is the known signal is taken, the result is as shown in FIG. 6A when the input is free from waveform distortion. On the other hand, when the input includes a waveform component reflected from an obstacle existing in the signal transmission channel, the result will be as shown in FIG. 6B. That is, the channel impulse response can be estimated. In FIG. 6B, the symbol α indicates the signal transmitted from the transmitting antenna and directly received by the receiving antenna, while the symbol β indicates the signal reflected by, for example, a building and received by the receiving antenna with a time difference Δt. Therefore, when the channel impulse response is detected, the desired impulse response of each of the equalizers 33 and 34 is determined so that the result of convolution between the detected channel impulse response and the desired equalizer impulse response becomes as close to the channel impulse response shown in FIG. 6A as possible, thereby determining the initial values of the weight coefficients of the weighting elements. More concretely, the matrix is prepared on the basis of the auto-correlation of the input of the equalizers 33, 34 and the cross-correlation between the equalizer input and the known signal so as to determine the initial values of weight coefficients by solving the matrix. The input signal is equalized by the use of the initial values of the weight coefficients so determined. These initial values are determined for each burst signal.

Figure 2:
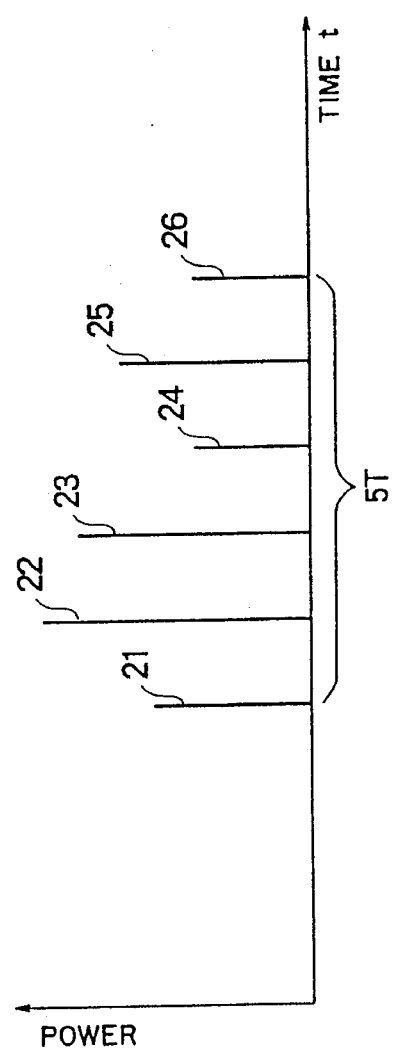
FIG. 2 is a waveform diagram showing an impulse response of a data signal transmission channel.

When the range of the signal waveform delays in the impulse response of the signal transmission channel is, for example, 5T as shown in FIG. 2, the maximum number of required taps is 6 in the case of the FIR type digital filter and 5 in the case of the IIR type digital filter. Thus, the range of the signal waveform delays differs depending on the condition of the signal transmission channel, and the maximum number of the required taps of each of the equalizers 33 and 34 differs also depending on the condition of the signal transmission channel. Suppose now that the impulse response of the signal transmission channel is, for example, as shown in FIG. 2. In such a case, the waveform components 23 to 26 are delayed by 4T from the main waveform component 22 relative to time, and the waveform component 21 is advanced by 1T from the main waveform component 22 relative to time. In this case, the FIR type digital filter having 2 taps and the IIR type digital filter having 4 taps can satisfactorily deal with the latter half data part of the burst signal, while the FIR type digital filter having 5 taps and the IIR type digital filter having 1 tap can satisfactorily deal with the former half data part of the burst signal. This is because, in the case of the equalizer used for equalizing the latter half data part of the burst signal in the order of from the reference signal part to the latter half data part in the direction of the arrow B in FIG. 1, the FIR type digital filter which is effective for cancelling the waveform component 21 appearing before the main waveform component 22 (whose power level is highest of all) relative to time requires a number of taps larger than p+1 at least, where p is the number of waveform components appearing before the main waveform component 22 relative to time, while the IIR type digital filter which is effective for cancelling the waveform components 23 to 26 appearing after the main waveform component 22 relative to time requires a number of taps larger than q at least, where q is the number of waveform components appearing after the main waveform component 22 relative to time. On the other hand, the equalizer dealing with the former half data part of the burst signal equalizes in the order of from the reference signal part to the former half data part in the direction of the arrow A in FIG. 1, that is, in the relation inverted with respect to time. Therefore, the number of taps of each of its digital filters is determined by inverting the impulse response shown in FIG. 2 with respect to time.

Thus, when the numbers of taps of the FIR type and IIR type digital filters forming the equalizer dealing with the latter half data part of the burst signal are A and B respectively, and those of the FIR type and IIR type digital filters forming the equalizer dealing with the former half data part of the burst signal are C and D respectively, these equalizers can operate to exhibit the performance equivalent to that of the prior art equalizer when the values of A, B, C and D are selected to satisfy the relations A+B=C+D=6, A+C=7 and B+D=5 (A, C=1 to 6, and B, D=0 to 5).

Therefore, each of the two equalizers is designed to include the selector switches 7 as shown in FIG. 4. It is considered herein that the range of signal waveform delays is nT (n: a natural number). According to such a consideration, the above relations among A, B, C and D are now expressed as A+B=C+D=n+1, A+C=n+2, and B+D=n (A, C=1 to n+1, and B, D=0 to n). Thus, whereas the total number of taps of the prior art equalizer is 2×(2n+1), the total number of taps of the two equalizers used in the present invention is 2×(n+1) which is about the half of the prior art value.

Figure 7:
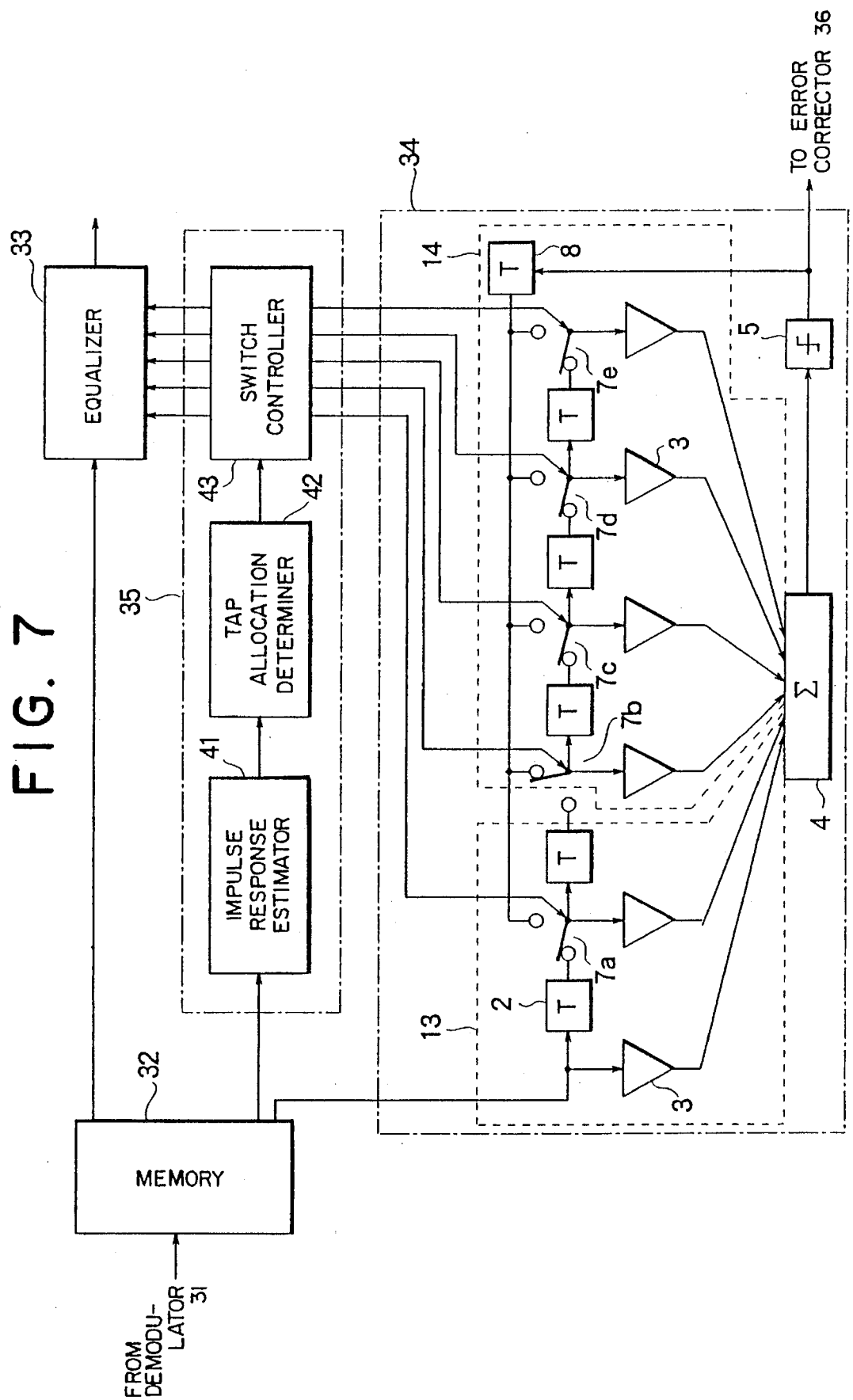
FIG. 7 is a block diagram showing in detail the relation between the controller and one of the equalizers shown in FIG. 5.

The manner of switch-over of the selector switches 7 will be described by reference to FIG. 7. In FIG. 7, the equalizer 34 controlled by the controller 35 is used to deal with the latter half data part of the burst signal. Referring to FIG. 7, an impulse response estimator 41 estimates the channel impulse response, and, on the basis of the estimated channel impulse response, a tap allocation determiner 42 determines the allocation of the taps. The output of the tap allocation determiner 42 is applied to a switch controller 43 which controls the selector switches 7. Describing in more detail, the channel impulse response estimator 41 computes the cross-correlation between the received signal (temporarily stored in and outputted from the memory 32) and the known signal (the fixed value), and the result of computation of the cross-correlation is regarded as the channel impulse response. In response to the output from the channel impulse response estimator 41, the tap allocation determiner 42 detects the timing of appearance of the main waveform component 22 (having the highest power level) with respect to time, and, on the basis of the detected timing of the main waveform component 22 (which appears as a second waveform component in FIG. 2), determines the respective numbers of taps to be allocated to the FIR type and IIR type digital filters. Table 1 shows the number of taps allocated to each of the FIR type and IIR type digital filters together with the position of each of the selector switches 7a to 7e, by way of example. The switch controller 43 controls the position of each of the selector switches 7a to 7e in the equalizer according to the result of the tap allocation determined by the tap allocation determiner 42 as shown in Table 1. Also, when the number of required taps of the FIR type digital filter in the equalizer dealing with the latter half data part of the burst signal is so determined, the number of required taps of the IIR type digital filter in the equalizer dealing with the latter half data part of the burst signal, and those of the FIR type and IIR type digital filters forming the equalizer dealing with the former half data part of the burst signal can be primarily determined. Therefore, the information regarding the number of required taps of the FIR type digital filter only of the equalizer dealing with the latter half data part of the burst signal need be supplied from the tap shaping determiner 42 to the switch controller 43. FIG. 7 shows that only the selector switch 7b is set in its "upper" position, and, in this case, the number of taps of the FIR type digital filter is 2, while that of the IIR type digital filter is 4. In FIG. 7, these digital filters are indicated by the blocks surrounded by the broken lines 13 and 14 respectively.

TABLE 1

| Number of taps | | Position of selector switches 7 | | | | |
|---|---|---|---|---|---|---|
| FIR type | IIR type | 7a | 7b | 7c | 7d | 7e |
| 6 | 0 | low | low | low | low | low |
| 5 | 1 | low | low | low | low | up |
| 4 | 2 | low | low | low | up | low |
| 3 | 3 | low | low | up | low | low |
| 2 | 4 | low | up | low | low | low |
| 1 | 5 | up | low | low | low | low |

Therefore, the selector switches 7 shown in FIG. 4 operate relative to each other as shown in Table 1 according to the condition of the signal transmission channel so that the numbers of taps of the FIR type and IIR type digital filters are allocated respectively to meet the relations described above. The output signal from the memory 32 is stored in the delay lines of the delay elements 2, and, after the outputs from the individual taps are multiplied by the weight coefficients of the respective weighting elements 3, the outputs from the weighting elements 3 are added together in the adder 4, so that the adder 4 provides the output in which waveform distortion due to signal transmission through the signal transmission channel is compensated by the function of the FIR type digital filter. The output from the adder 4 is converted into the predetermined amplitude by the discriminator 5. (In the case of, for example, the GMSK modulation, the discriminator 5 generates its output 1 and −1 when its input is positive and negative respectively.) The discriminator output appears as the output 6 from the equalizer and is, at the same time, fed back through the delay element 8, so that waveform distortion due to signal transmission through the transmission channel is also compensated by the function of the IIR type digital filter.

It will be understood from the foregoing description of the embodiment of the equalizer according to the present invention that the number of taps of the FIR type digital filter and that of the IIR type digital filter are shaped by the function of the selector switches 7 each time the burst signal is received. Therefore, the present invention is advantageous in that the total number of the required taps of the equalizer can be reduced to about half of the prior art value.

We claim:

1. An equalizer for use in a data receiver apparatus, comprising:

a plurality of delay elements storing a data signal transmitted through a signal transmission channel and received by a receiving antenna, said plurality of delay elements defining a plurality of taps equal in number to a smallest number of taps necessary to perform any one of a plurality of signal processing operations, each of said taps having associated therewith a respective one of a plurality of functions;

a plurality of weighting elements multiplying the data signal successively stored in said plural delay elements by their weight coefficients respectively;

an adder adding output signals from said plurality of weighting elements to obtain a result of addition;

a discriminator converting the result of addition by said adder into a predetermined amplitude;

a plurality of selector switches; and control means, responsive to a burst signal identifying a first one of said plurality of signal processing operations, for selectively switching over the plurality of selector switches to perform allocation of said taps among a plurality of different operations required to perform said first one of said plurality of signal processing operations, said allocation of said taps being that which is necessary for performing said first one of said plurality of signal processing operations, said control means maintaining a total number of said taps that are used for each of said plurality of signal processing operations to be equal to said smallest number and altering with respect to different ones of said plurality of signal processing operations said allocation of said taps among said plurality of different operations to perform a constant number of said functions to execute said plurality of signal processing operations, wherein said control means allocates at least one of said plurality of taps to a first one of said plurality of different operations for said first one of said plurality of signal processing operations and to a second one of said plurality of different operations for a second one of said plurality of signal processing operations, said control means allocating said taps in accordance with a maximum time difference of said plurality of delay elements.

2. An equalizer according to claim 1, wherein said control means comprises a controller that controls switching of said selector switches by estimating an impulse response of the signal transmission channel and that selects the allocation of said taps in accordance with a time where the impulse response is made maximum.

3. An equalizer according to claim 1, wherein:

said first one of said plurality of different operations is a forward side operation; and said second one of said plurality of different operations is a backward side operation.

4. An equalizer for use in a data receiver apparatus, comprising:

a plurality of delay elements storing a data signal transmitted through a signal transmission channel and received by a receiving antenna, said plurality of delay elements defining a plurality of taps, each of said taps having associated therewith a respective one of a plurality of functions;

a plurality of weighting elements multiplying the data signal successively stored in said plural delay elements by their weight coefficients respectively;

an adder adding output signals from said plurality of weighting elements to obtain a result of addition;

a discriminator converting the result of addition by said adder into a predetermined amplitude;

a plurality of selector switches; and control means, responsive to a burst signal identifying a first one of a plurality of signal processing operations, for selectively switching over the plurality of selector switches to perform allocation of said taps among a plurality of different operations required to perform said first one of said plurality of signal processing operations, said allocation of said taps being that which is necessary for performing said first one of said plurality of signal processing operations, said control means maintaining constant a total number of said taps that are used for each of said plurality of signal processing operations and altering with respect to different ones of said plurality of signal processing operations said allocation of said taps among said plurality of different operations to perform a constant number of said functions to execute said plurality of signal processing operations;

wherein said control means allocates at least one of said plurality of taps to a first one of said plurality of different operations for said first one of said plurality of signal processing operations and to a second one of said plurality of different operations for a second one of said plurality of signal processing operations, said control means allocating said taps in accordance with a maximum time difference of said plurality of delay elements;

wherein said plurality of different operations comprise a finite impulse response filtering operation and an infinite impulse response filtering operation.

5. An equalizer according to claim 4, wherein:

said data signal has a range of waveform delays equal to nT, where n is a natural number and T is a length of time required for transmission of one symbol of said data signal;

a number of said taps which said control means allocates for said finite impulse response filtering operation is equal to A;

a number of said taps which said control means allocates for said infinite impulse response filtering operation is equal to B; and $A+B=n+1$.

6. An equalizer for use in a data receiver apparatus, comprising:

a plurality of delay elements storing a data signal transmitted through a signal transmission channel and received by a receiving antenna, said plurality of delay elements defining a plurality of taps, each of said taps having associated therewith a respective one of a plurality of functions;

a plurality of weighting elements multiplying the data signal successively stored in said plural delay elements by their weight coefficients respectively;

an adder adding output signals from said plurality of weighting elements to obtain a result of addition;

a discriminator converting the result of addition by said adder into a predetermined amplitude;

a plurality of selector switches; and control means, responsive to a burst signal identifying a first one of a plurality of signal processing operations, for selectively switching over the plurality of selector switches to perform allocation of said taps among a plurality of different operations required to perform said first one of said plurality of signal processing operations, said allocation of said taps being that which is necessary for performing said first one of said plurality of signal processing operations, said control means maintaining constant a total number of said taps that are used for each of said plurality of signal processing operations and altering with respect to different ones of said plurality of signal processing operations said allocation of said taps among said plurality of different operations to perform a constant number of said functions to execute said plurality of signal processing operations, said control means allocating at least one of said plurality of taps to a first one of said plurality of different operations for said first one of said plurality of signal processing operations and to a second one of said plurality of different operations for a second one of said plurality of signal processing operations, said control means allocating said taps in accordance with a maximum time difference of said plurality of delay elements;

wherein said plurality of different operations comprise a forward side operation performed on a portion of said data signal after a main waveform component of said data signal and a backward side operation performed on a portion of said data signal before said main waveform component of said data signal.

7. An equalizer for use in a data receiver apparatus, comprising:

a plurality of delay elements storing a data signal transmitted through a signal transmission channel and received by a receiving antenna, said plurality of delay elements defining a plurality of taps, each of said taps having associated therewith a respective one of a plurality of functions;

a plurality of weighting elements multiplying the data signal successively stored in said plural delay elements by their weight coefficients respectively;

an adder adding output signals from said plurality of weighting elements to obtain a result of addition;

a discriminator converting the result of addition by said adder into a predetermined amplitude;

a plurality of selector switches; and control means, responsive to a burst signal identifying a first one of plurality of signal processing operations, for selectively switching over the plurality of selector switches to perform allocation of said taps among a plurality of different operations required to perform said first one of said plurality of signal processing operations, said allocation of said taps being that which is necessary for performing said first one of said plurality of signal processing operations, said control means maintaining constant a total number of said taps that are used for each of said plurality of signal processing operations and altering with respect to different ones of said plurality of signal processing operations said allocation of said taps among said plurality of different operations to perform a constant number of said functions to execute said plurality of signal processing operations, said control means allocating at least one of said plurality of taps to a first one of said plurality of different operations for said first one of said plurality of signal processing operations and to a second one of said plurality of different operations for a second one of said plurality of signal processing operations, said control means allocating said taps in accordance with a maximum time difference of said plurality of delay elements;

wherein:

said data signal has a range of waveform delays equal to nT, where n is a natural number and T is a length of time required for transmission of one symbol of said data signal; and said plurality of delay elements define n+1 taps.

8. An equalizer for use in a data receiver apparatus, comprising:

a plurality of delay elements successively delaying an input signal transmitted through a signal transmission channel and received by a receiving antenna, said plurality of delay elements defining a plurality of taps, each of said taps having associated therewith a respective one of a plurality of functions;

a plurality of weighting elements multiplying the input signal and successively delayed output signals from said plurality of delay elements by their weight coefficients respectively;

an adder adding output signals from said plurality of weighting elements;

a discriminator converting a result of addition by said adder into a predetermined amplitude;

feedback paths including a further delay element for feeding back an output signal of said discriminator to respective output terminals of said plurality of delay elements;

a plurality of selector switches; and control means for selecting said feedback paths to selectively connect the output signals of said plurality of delay elements to inputs of said plurality of weighting elements, said control means maintaining constant a total number of said taps that are used for each of a plurality of signal processing operations and altering only an allocation of said taps among a plurality of different operations to perform a constant number of said functions to execute said signal processing operations;

wherein:

said input signal has a range of waveform delays equal to nT, where n is a natural number and T is a length of time required for transmission of one symbol of said input signal; and said plurality of delay elements define n+1 taps.

9. A data receiver apparatus including:

a memory storing a received signal transmitted through a signal transmission channel and demodulated into its baseband signal by a demodulator;

an equalizer equalizing the received signal to provide an equalized output signal;

an error corrector correcting any error included in the output signal from said equalizer to provide an error corrected output signal; and a voice decoder decoding voice data of the output signal of said error corrector, said equalizer comprising:

a plurality of delay elements successively delaying the received signal applied to said equalizer from said memory to provide successively delayed output signals;

a plurality of weighting elements multiplying the received signal from said memory and the successively delayed output signals from said plurality of delay elements by their weight coefficients respectively, each of said plurality of weighting elements having associated therewith a respective one of a plurality of functions;

an adder adding output signals from said weighting elements to obtain a result of addition;

a discriminator converting the result of addition by said adder into a predetermined amplitude;

feedback paths including a further delay element for feeding an output of said discriminator back to the respective output terminals of said plurality of delay elements; and a plurality of selector switches; and control means for selecting said feedback paths to selectively connect output terminals of said plurality of delay elements to the input terminals of said plurality of weighting elements, wherein said control means maintains constant a total number of said weighting elements that are used for each of a plurality of signal processing operations and alters only an allocation of said weighting elements among a plurality of different operations performed by said equalizer, said control means allocating said plurality of weighting elements in accordance with a maximum time difference of said plurality of delay elements to perform a constant and minimized number of said functions to execute said signal processing operations;

wherein:

said received signal has a range of waveform delays equal to nT, where n is a natural number and T is a length of time required for transmission of one symbol of said received signal; and said plurality of delay elements define n+1 taps.

10. An equalizer for use in a data receiver apparatus, comprising:

a plurality of delay elements storing a data signal transmitted through a signal transmission channel and received by a receiving antenna, said plurality of delay elements defining a plurality of taps, each of said taps having associated therewith a respective one of a plurality of functions;

a plurality of weighting elements multiplying the data signal successively stored in said plural delay elements by their weight coefficients respectively;

an adder adding output signals from said plurality of weighting elements to obtain a result of addition;

a discriminator converting the result of addition by said adder into a predetermined amplitude;

a plurality of selector switches; and control means, responsive to a burst signal identifying a first one of a plurality of signal processing operations, for selectively switching over the plurality of selector switches to perform allocation of said taps among a plurality of different operations required to perform said first one of said plurality of signal processing operations, said allocation of said taps being that which is necessary for performing said first one of said plurality of signal processing operations, said control means maintaining constant a total number of said taps that are used for each of said plurality of signal processing operations and altering with respect to different ones of said plurality of signal processing operations said allocation of said taps among said plurality of different operations to perform a constant number of said functions to execute said plurality of signal processing operations, said control means allocating at least one of said plurality of taps to a first one of said plurality of different operations for said first one of said plurality of signal processing operations and to a second one of said plurality of different operations for a second one of said plurality of signal processing operations, said control means allocating said taps in accordance with a maximum time difference of said plurality of delay elements;

wherein said control means comprises a tap allocation determiner for determining said allocation.

11. An equalizer for use in a data receiver apparatus, comprising:

a plurality of delay elements successively delaying an input signal transmitted through a signal transmission channel and received by a receiving antenna, said plurality of delay elements defining a plurality of taps, each of said taps having associated therewith a respective one of a plurality of functions;

a plurality of weighting elements multiplying the input signal and successively delayed output signals from said plurality of delay elements by their weight coefficients respectively;

an adder adding output signals from said plurality of weighting elements;

a discriminator converting a result of addition by said adder into a predetermined amplitude;

feedback paths including a further delay element for feeding back an output signal of said discriminator to respective output terminals of said plurality of delay elements;

a plurality of selector switches; and control means for selecting said feedback paths to selectively connect the output signals of said plurality of delay elements to inputs of said plurality of weighting elements, said control means maintaining constant a total number of said taps that are used for each of a plurality of signal processing operations and altering only an allocation of said taps among a plurality of different operations to perform a constant number of said functions to execute said signal processing operations;

wherein said control means comprises a tap allocation determiner for determining said allocation.

12. An equalizer for use in a data receiver apparatus, comprising:

a plurality of delay elements successively delaying an input signal transmitted through a signal transmission channel and received by a receiving antenna, said plurality of delay elements defining a plurality of taps;

a plurality of weighting elements multiplying the input signal and successively delayed output signals from said plurality of delay elements by their weight coefficients respectively;

an adder adding output signals from said plurality of weighting elements;

a discriminator converting a result of addition by said adder into a predetermined amplitude;

feedback paths including a further delay element for feeding back an output signal of said discriminator to respective output terminals of said plurality of delay elements;

a plurality of selector switches; and control means for selecting said feedback paths to selectively connect the output signals of said plurality of delay elements to inputs of said plurality of weighting elements, said control means maintaining constant a total number of said taps that are used and altering only an allocation of said taps among a plurality of different operations to provide a constant number of signal processing operations, wherein:

said plurality of taps are equal in number to a smallest number of taps necessary to perform any one of said signal processing operations; and said total number of said taps that are used for each of said signal processing operations is equal to said smallest number; said control means allocating at least one of said plurality of taps to a first one of said plurality of different operations for a first one of said signal processing operations and to a second one of said plurality of different operations for a second one of said signal processing operations.

13. An equalizer for use in a data receiver apparatus, comprising:

a plurality of delay elements successively delaying an input signal transmitted through a signal transmission channel and received by a receiving antenna, said plurality of delay elements defining a plurality of taps;

a plurality of weighting elements multiplying the input signal and successively delayed output signals from said plurality of delay elements by their weight coefficients respectively;

an adder adding output signals from said plurality of weighting elements;

a discriminator converting a result of addition by said adder into a predetermined amplitude;

feedback paths including a further delay element for feeding back an output signal of said discriminator to respective output terminals of said plurality of delay elements;

a plurality of selector switches; and control means for selecting said feedback paths to selectively connect the output signals of said plurality of delay elements to inputs of said plurality of weighting elements, said control means maintaining constant a total number of said taps that are used and altering only an allocation of said taps among a plurality of different operations to provide a constant number of signal processing operations, and wherein:

said control means comprises a controller that controls switching of said selector switches by estimating an impulse response of the signal transmission channel;

said plurality of taps are equal in number to a smallest number of taps necessary to perform any one of said signal processing operations; and said total number of said taps that are used for each of said signal processing operations is equal to said smallest number; said control means allocating at least one of said plurality of taps to a first one of said plurality of different operations for a first one of said signal processing operations and to a second one of said plurality of different operations for a second one of said signal processing operations.

14. A data receiver apparatus including:

a memory storing a received signal transmitted through a signal transmission channel and demodulated into its baseband signal by a demodulator;

an equalizer equalizing the received signal to provide an equalized output signal;

an error corrector correcting any error included in the output signal from said equalizer to provide an error corrected output signal; and a voice decoder decoding voice data of the output signal of said error corrector, said equalizer comprising:

a plurality of delay elements successively delaying the received signal applied to said equalizer from said memory to provide successively delayed output signals;

a plurality of weighting elements multiplying the received signal from said memory and the successively delayed output signals from said plurality of delay elements by their weight coefficients respectively;

an adder adding output signals from said weighting elements to obtain a result of addition;

a discriminator converting the result of addition by said adder into a predetermined amplitude;

feedback paths including a further delay element for feeding an output of said discriminator back to the respective output terminals of said plurality of delay elements; and a plurality of selector switches; and control means for selecting said feedback paths to selectively connect output terminals of said plurality of delay elements to the input terminals of said plurality of weighting elements, wherein said control means maintains constant a total number of said weighting elements that are used and alters only an allocation of said weighting elements among a plurality of different operations performed by said equalizer, said control means allocating said plurality of weighting elements in accordance with a maximum time difference of said plurality of delay elements to provide a constant and minimized number of signal processing operations, wherein said control means allocates at least one of said weighting elements to a first one of said plurality of different operations for a first one of said signal processing operations and to a second one of said plurality of different operations for a second one of said signal processing operations.

* * * * *